(12) United States Patent
Lee et al.

(10) Patent No.: US 8,202,795 B2
(45) Date of Patent: Jun. 19, 2012

(54) METHOD OF FABRICATING A SEMICONDUCTOR DEVICE HAVING A PLUG

(75) Inventors: Min-Suk Lee, Ichon-shi (KR); Won-Kyu Kim, Ichon-shi (KR)

(73) Assignee: Hynix Semiconductor Inc., Ichon-shi, Kyoungki-do (KR)

( * ) Notice: Subject to any disclaimer, the term of this patent is extended or adjusted under 35 U.S.C. 154(b) by 658 days.

(21) Appl. No.: 11/965,966

(22) Filed: Dec. 28, 2007

(65) Prior Publication Data

US 2009/0004855 A1    Jan. 1, 2009

(30) Foreign Application Priority Data

Jun. 28, 2007  (KR) .................. 10-2007-0064497

(51) Int. Cl.
*H01L 21/44*    (2006.01)
*H01L 21/4763*   (2006.01)
(52) U.S. Cl. ................. 438/607; 438/627; 257/E21.428
(58) Field of Classification Search ........... 257/E21.428; 438/607, 627
See application file for complete search history.

(56) References Cited

U.S. PATENT DOCUMENTS

| | | | | |
|---|---|---|---|---|
| 2004/0009644 A1* | 1/2004 | Suzuki | ........................ | 438/270 |
| 2004/0082162 A1* | 4/2004 | Kang et al. | .................... | 438/629 |
| 2004/0102039 A1* | 5/2004 | Lim et al. | ...................... | 438/674 |
| 2004/0121536 A1 | 6/2004 | Hung et al. | | |
| 2004/0219462 A1* | 11/2004 | Chen et al. | .................... | 430/311 |
| 2005/0085072 A1 | 4/2005 | Kim et al. | | |
| 2005/0095793 A1 | 5/2005 | Lee | | |
| 2005/0136642 A1 | 6/2005 | Lee et al. | | |
| 2005/0142779 A1* | 6/2005 | Cheong et al. | ................ | 438/300 |
| 2005/0142867 A1* | 6/2005 | Park et al. | ...................... | 438/657 |
| 2006/0003530 A1* | 1/2006 | Kim et al. | ..................... | 438/258 |
| 2007/0128805 A1 | 6/2007 | Kim et al. | | |
| 2008/0160740 A1* | 7/2008 | Ahn et al. | ..................... | 438/586 |

FOREIGN PATENT DOCUMENTS

| | | |
|---|---|---|
| KR | 10-2004-0019172 | 3/2004 |
| KR | 10-2005-0045715 | 5/2004 |
| KR | 10-0533980 | 11/2005 |
| KR | 10-0564434 | 3/2006 |

OTHER PUBLICATIONS

Office Action dated Dec. 4, 2009, for Chinese application No. 200710306327.1.
Korean Office Action dated Sep. 29, 2008, for Korean application No. 10-2007-0064497.
Chinese Office Action for application No. 200710306327.1.
Chinese Patent Certificate and Publication of Granted Chinese invention for CN 101335231 dated Feb. 1, 2012, citing the above reference(s).

* cited by examiner

*Primary Examiner* — Matthew Landau
*Assistant Examiner* — Daniel Luke
(74) *Attorney, Agent, or Firm* — Lowe Hauptman Ham & Berner LLP

(57) ABSTRACT

A method of fabricating a semiconductor device, the method includes forming gate patterns on a substrate, recessing the substrate between the gate patterns, thereby forming a first resulting structure including recesses, forming a gate spacer layer on an entire surface of the first resulting structure including the gate patterns, etching the gate spacer layer at a bottom of the recess, and forming a plug on the recess, thereby forming a second resulting structure including the plug.

52 Claims, 14 Drawing Sheets

METHOD OF FABRICATING A SEMICONDUCTOR DEVICE HAVING A PLUG

CROSS-REFERENCE TO RELATED APPLICATIONS

The present invention claims priority of Korean patent application number 10-2007-0064497, filed on Jun. 28, 2007, which is incorporated by reference in its entirety.

BACKGROUND OF THE INVENTION

The present invention relates to a semiconductor fabrication technology and, more particularly, to a method of forming a landing plug contact of a semiconductor device.

As a semiconductor device becomes highly integrated, a space between gate patterns gets narrower so that a substrate portion for a landing plug contact, which is formed between the gate patterns, gets smaller. Since cell contact resistance continuously increases as a contact area decreases, a technology to reduce the cell contact resistance is necessary.

Accordingly, a pre-selective epitaxial growth (SEG) plug process has been used. In the pre-SEG plug process, an SEG plug having a given thickness is formed between the gate patterns before the landing plug contact is formed. After forming a gate spacer at sidewalls of the gate pattern before a formation of a cell spacer, a substrate is exposed by using the gate spacer as an etching barrier layer and the SEG plug is formed on the exposed substrate. Since a contact open area increases as much as a thickness of the cell spacer, the cell contact resistance decreases.

Meanwhile, in order to secure refresh characteristics of the semiconductor device, a technology of a recessed gate structure has been suggested, which is a 3D gate structure formed by recessing a region under the gate pattern to increase a channel length.

However, since there is no isolation layer which electrically insulates the recessed lower portion of the gate pattern from the SEG plug, an electrical short between the recess region and the SEG plug may occur (see FIG. 1). Such a phenomenon gets worse when an overlay of the gate pattern is done in the opposite direction to that of the recess region by misalignment.

If the thickness of the gate spacer is increased to solve such a limitation, there is a side effect in that a cell contact open area is reduced. Even in this case, there exists no isolation layer between the recess region and the SEG plug, an electrical insulation cannot be secured.

SUMMARY OF THE INVENTION

The present invention is directed to providing a method of fabricating a semiconductor device capable of reducing cell contact resistance.

Also, the present invention is directed to providing a method of fabricating a semiconductor device capable of electrically insulating a recess region of a gate pattern from a selective epitaxial growth (SEG) plug when the SEG plug is applied.

According to an aspect of the present invention, there is provided a method of fabricating a semiconductor device, the methods includes forming gate patterns over a substrate; forming a recess in the substrate between the gate patterns, thereby forming a first resulting structure including the recess; forming a gate spacer layer on an entire surface of the first resulting structure including the gate patterns; etching the gate spacer layer at a bottom of the recess; and forming a plug on the recess, thereby forming a second resulting structure including the plug.

According to another aspect of the present invention, there is provided a method of fabricating a semiconductor device, the method includes forming gate patterns over a substrate having a cell area and a peripheral area; forming a recess in the substrate between the gate patterns in the cell area, thereby forming a first resulting structure; forming a gate spacer layer on an entire surface of the first resulting structure including the recess; forming a mask pattern on the gate spacer layer in the peripheral area; etching the gate spacer layer at a bottom of the recess in the cell area; and forming a plug on the recess.

According to a further aspect of the present invention, there is provided a method of fabricating a semiconductor device, the method includes forming gate patterns over a substrate having a cell area and a peripheral area, thereby forming a first resulting structure; forming a first gate spacer layer on an entire surface of the first resulting structure including the gate patterns; forming a mask pattern on the first gate spacer layer in the peripheral area; etching the first gate spacer layer to expose the substrate between the gate patterns in the cell area; forming a recess in the exposed substrate; removing the mask pattern, thereby forming a second resulting structure; forming a second gate spacer layer on an entire surface of the second resulting structure including the recess; etching the second gate spacer layer at a bottom of the recess in the cell area; and forming a plug on the recess in the cell area, thereby forming a third resulting structure including the plug.

DETAILED DESCRIPTION OF THE PREFERRED EMBODIMENTS

FIGS. 2A to 2F illustrate cross-sectional views of a method of fabricating a semiconductor device according to a first embodiment of the present invention.

Figure 1:
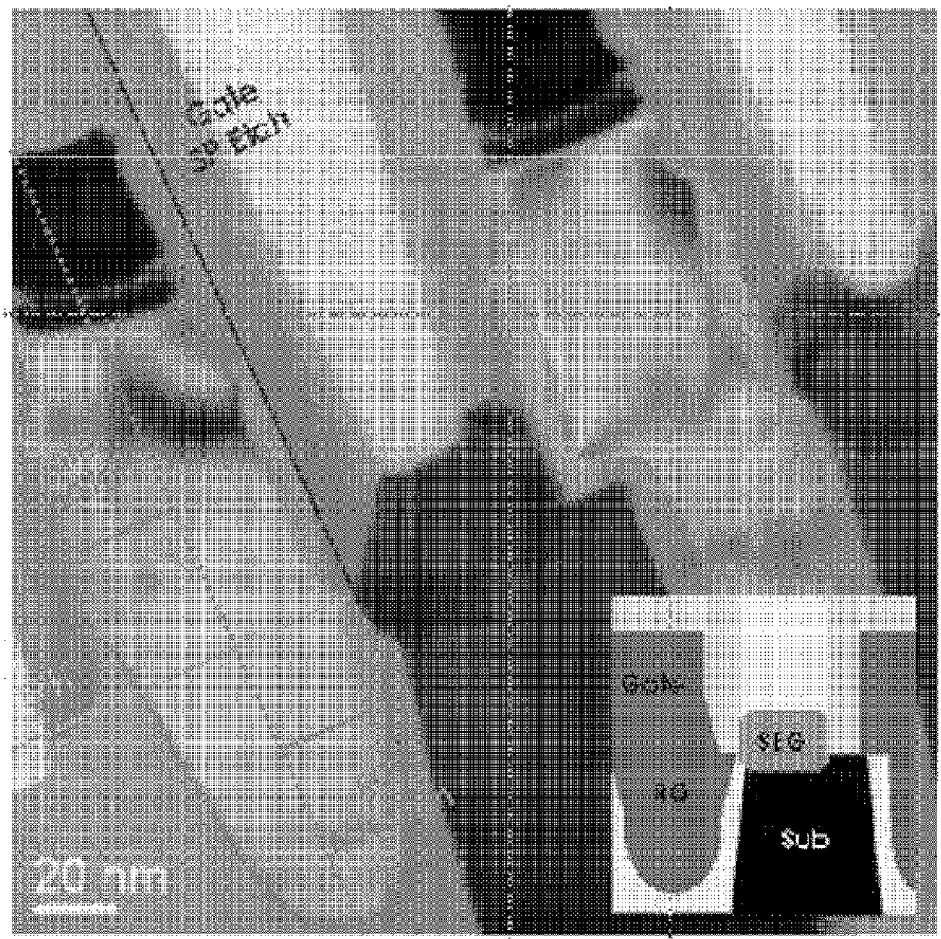
FIG. 1 illustrates a micrographic view of a conventional semiconductor device.
Figure 2A:
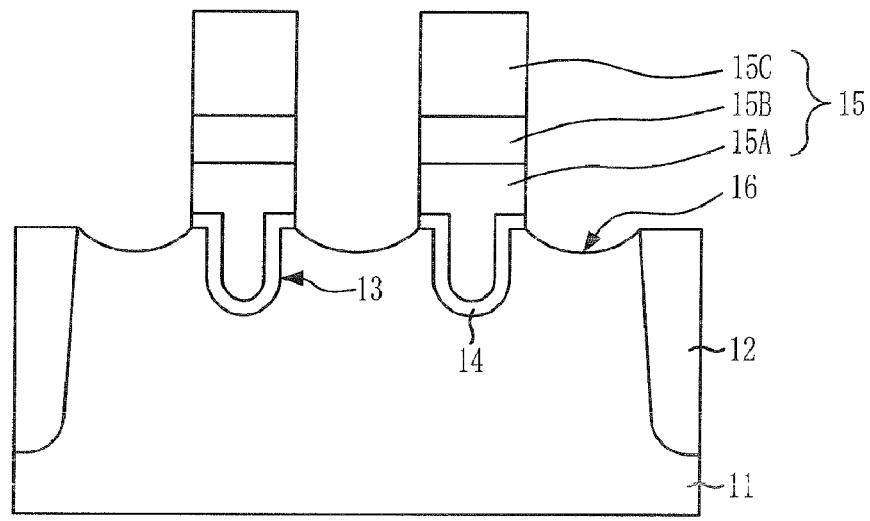
FIGS. 2A to 2F illustrate cross-sectional views of a method of fabricating a semiconductor device according to a first embodiment of the present invention.

As shown in FIG. 2A, an isolation layer 12 is formed on a substrate 11. Here, the substrate 11 can be a semiconductor substrate where a dynamic random access memory (DRAM) process is performed, and the isolation layer 12, which is used to define an active region, can be formed by using a shallow trench isolation (STI) process.

The substrate 11 is selectively etched in a given depth to form a recess region 13. Here, the recess region 13 increases a channel length to improve refresh characteristics. Although the recess region 13 having a U-shape is illustrated in FIG. 2A, the recess region 13 can also have any one of a bulb shape, a pin shape or a saddle shape.

A gate pattern 15, a portion of which is buried in the recess region 13 and the remaining portion of which protrudes from an upper portion of the substrate 11, is formed. A gate insulation layer 14 is formed on the substrate 11 including the recess region 13 before the gate pattern 15 is formed. Here, the gate pattern 15 can have a stacked structure including a first gate electrode 15A, a second gate electrode 15B and a gate hard mask 15C. The first gate electrode 15A can be a polysilicon, the second gate electrode 15B can be a metal or a metal silicide and the gate hard mask 15C can be a nitride layer.

The substrate 11 between the gate patterns 15 is etched in a given depth to be recessed. The recessed portion of the substrate 11 includes a plug region 16 in which a landing plug contact is to be formed. The plug region 16 is formed to have a depth which does not affect a junction. The depth of the plug region 16 can be approximately 50 Å to approximately 500 Å.

Figure 2B:
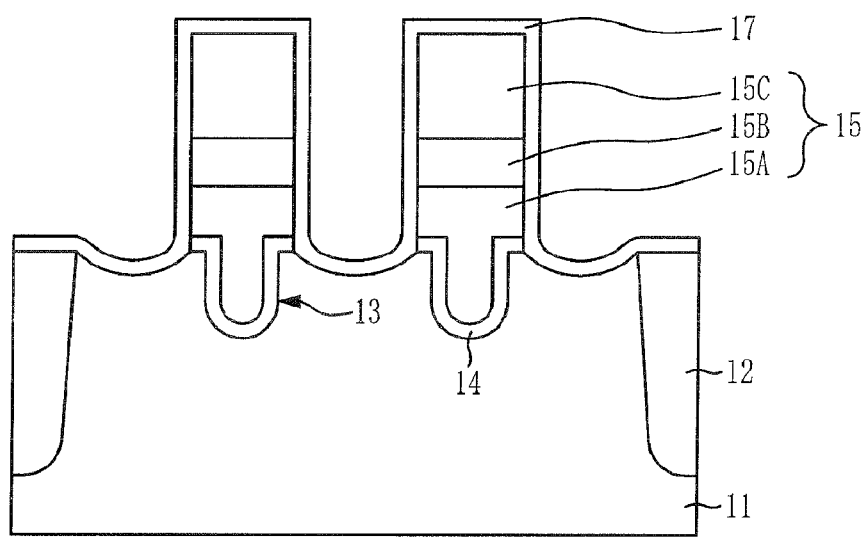

As shown in FIG. 2B, a gate spacer layer 17 is formed on an entire surface of the resulting structure including the plug region 16. Here, the gate spacer layer 17 can be formed to have a thickness ranging from approximately 80 Å to approximately 150 Å, considering thickness loss caused by a subsequent spacer etching process and post-etch treatment. In this case, the gate spacer layer 17 having a thickness ranging from approximately 30 Å to approximately 50 Å remains on sidewalls of the gate patterns 15 after the subsequent spacer etching process and post-etch treatment are performed. Thus, a sufficient electrical insulation between a selective epitaxial growth (SEG) plug and the recess region 13 is possible.

Figure 2C:
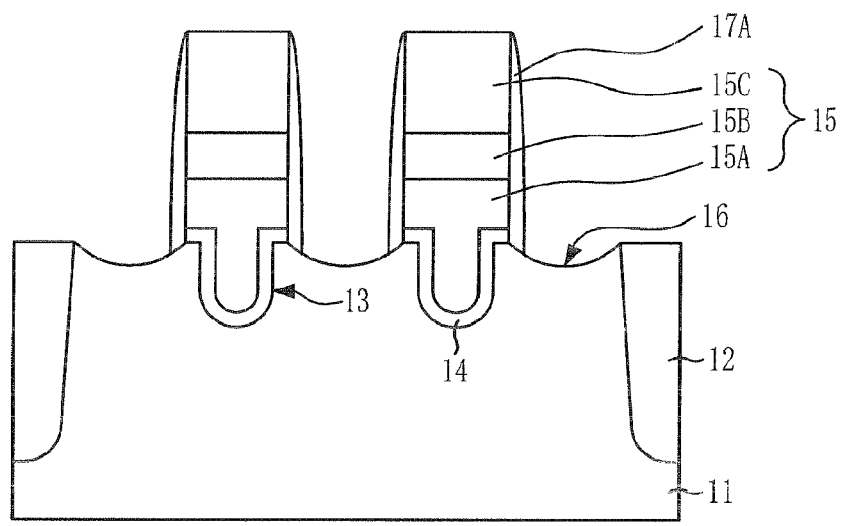

As shown in FIG. 2C, the gate spacer layer 17 is etched to expose the substrate 11 at the bottom of the plug region 16. The gate spacer layer 17 may be etched by an etch-back process, leaving the gate spacer layer 17 on the sidewalls of the gate pattern 15. Hereinafter, the gate spacer layer 17 remaining on the sidewalls of the gate pattern 15 will be referred as a gate spacer 17A. Even in case that misalignment between the gate pattern 15 and the recess region 13 occurs, the electrical insulation between the recess region 13 and the subsequent SEG plug is secured because the gate spacer 17A remains at sidewalls of the plug region 16.

Figure 2D:
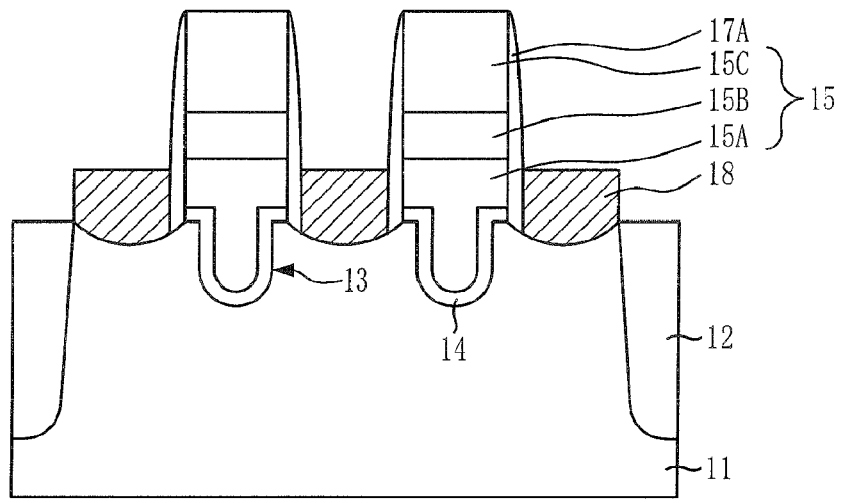

As shown in FIG. 2D, a first plug 18 is formed on the plug region 16. The first plug 18 can be an SEG plug formed through a selective epitaxial growth process. Further, the first plug 18 can be formed to have a thickness ranging from approximately 200 A to approximately 300 A. Also, a post-etch treatment (cleaning) can be performed before the first plug 18 is formed.

Since the first plug 18 is formed before formation of a subsequent cell spacer, a substrate contact area can be increased as much as the thickness of the cell spacer, thereby reducing cell contact resistance. Also, a gap-fill margin can be secured as much as a height of the first plug 18 when a subsequent insulation layer is formed.

Figure 2E:
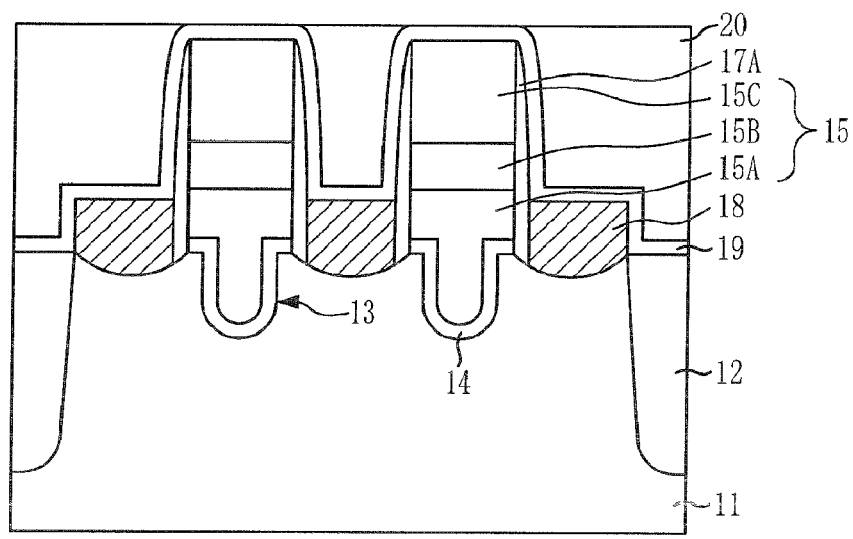

As shown in FIG. 2E, a cell spacer layer 19 is formed on the entire surface of the resulting structure including the first plug 18. Here, the cell spacer layer 19 is used to prevent the penetration of impurities into the substrate 11 and the first plug 18 from a subsequent insulation layer. The cell spacer layer 19 can be formed out of a nitride layer.

Then, an insulation layer 20 is formed to fill all spaces between the gate patterns 15 on the cell spacer layer 19. Here, the insulation layer 20 is used for the insulation between the gate patterns 15. The insulation layer 20 can be formed out of a boron phosphorus silicate glass (BPSG) having an excellent gap-fill margin. Subsequently, the insulation layer 20 is planarized until the cell spacer layer 19 is exposed.

Figure 2F:
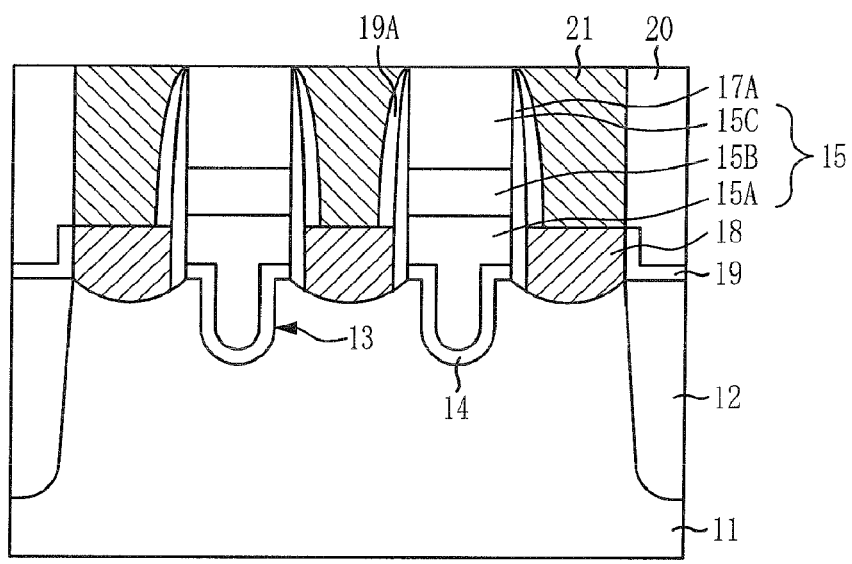

As shown in FIG. 2F, a contact hole is formed to expose the first plug 18 between the gate patterns 15 and then a conductive layer is formed and planarized to form a second plug 21.

In detail, a mask pattern is formed on the insulation layer 20 to define a region in which a landing plug contact is to be formed between the gate patterns 15 and the contact hole is formed to expose the first plug 18 using a self-aligned contact etching process. Through the self-aligned contact etching process, the cell spacer layer 19 remains at sidewalls of the gate pattern 15. Hereinafter, the cell spacer layer 19 remaining at the sidewalls of the gate patterns 15 after the self-aligned contact etching process will be referred to as a cell spacer pattern 19A. Then, the conductive layer is formed on the first plug 18 to fill in the space between the gate patterns 15 and is planarized until the gate hard mask 15C is exposed so as to form the second plug 21. Here, the conductive layer can be a polysilicon and the planarization is carried out by an etch-back process or a chemical-mechanical polishing (CMP). The first and second plugs 18 and 21 include a landing plug contact.

FIGS. 3A to 3F illustrate cross-sectional views of a method of fabricating a semiconductor device according to a second embodiment of the present invention.

Figure 3A:
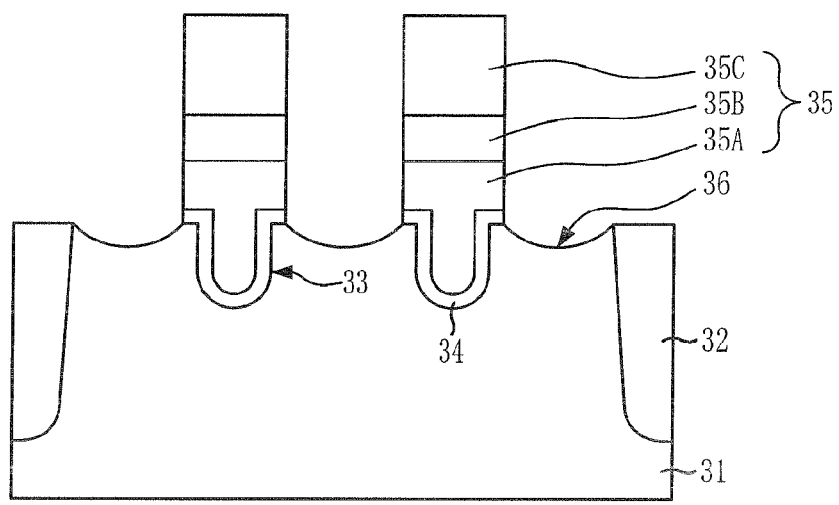
FIGS. 3A to 3F illustrate cross-sectional views of a method of fabricating a semiconductor device according to a second embodiment of the present invention.

As shown in FIG. 3A, an isolation layer 32 is formed on a substrate 31. Here, the substrate 31 can be a semiconductor substrate where a DRAM process is performed, and the isolation layer 32, which is used to define an active region, can be formed by using a shallow trench isolation (STI) process.

The substrate 31 is selectively etched in a given depth to form a recess region 33. Here, the recess region 33 increases a channel length to improve refresh characteristics. Although the recess region 33 having a U-shape is illustrated in FIG. 3A, the recess region 13 can also have any one of a bulb shape, a pin shape or a saddle shape.

Then, a gate pattern 35, a portion of which is buried in the recess region 33 and the remaining portion of which protrudes from an upper portion of the substrate 31, is formed. A gate insulation layer 34 can be formed on the substrate 31 including the recess region 33 before the gate pattern 35 is formed. The gate pattern 35 can have a stacked structure including a first gate electrode 35A, a second gate electrode 35B and a gate hard mask 35C. The first gate electrode 35A can be a polysilicon, the second gate electrode 35B can be a metal or a metal silicide and the gate hard mask 35C can be a nitride layer.

Then, the substrate 31 between the gate patterns 35 is etched in a given depth to be recessed. The recessed portion of the substrate 31 comprises a plug region 36 in which a landing plug contact is to be formed. The plug region 36 is formed to have a depth which does not affect a junction. The depth of the plug region 36 can be approximately 50 A to approximately 500 A.

Figure 3B:
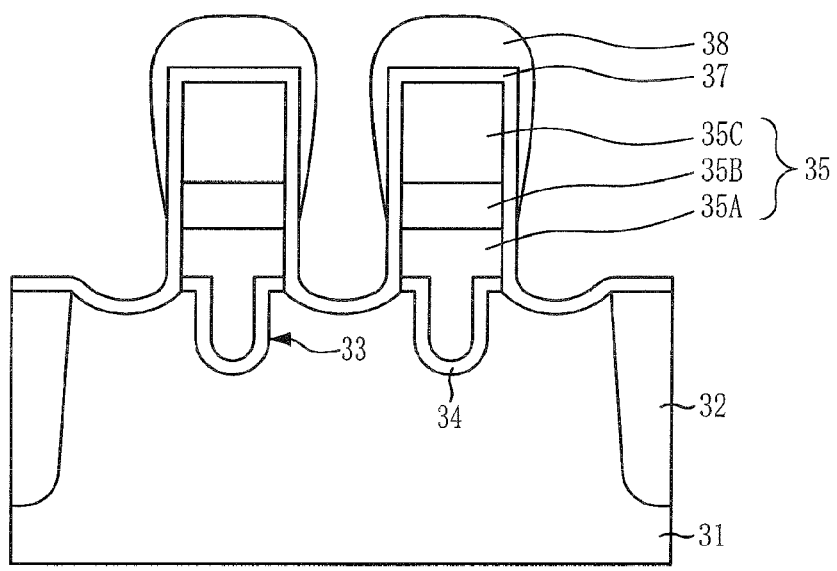

As shown in FIG. 3B, a gate spacer layer 37 is formed on the entire surface of the resulting structure including the plug region 36. Here, the gate spacer layer 37 can be formed to have a thickness ranging from approximately 80 A to approximately 150 A, considering thickness loss caused by a subsequent spacer etching process and post-etch treatment. In this case, the gate spacer layer 37 having a thickness ranging from approximately 30 A to approximately 50 A remains on sidewalls of the gate patterns 35 after the subsequent spacer etching process and post-etch treatment are performed. Thus, a sufficient electrical insulation between a subsequent selective epitaxial growth (SEG) plug and the recess region 33 is possible.

Subsequently, an etching barrier layer 38 is formed on the gate spacer layer 37. Here, the etching barrier layer 38 formed on the upper portion of the gate pattern 35 is thicker than that formed at the sidewalls of the gate pattern 35. The etching barrier layer 38 can be formed to have a thickness on the upper portion of the gate pattern 35 ranging from approximately 300 A to approximately 800 A. The etching barrier layer 38 can be formed of plasma enhanced undoped silicate glass (PE-USG).

Figure 3C:
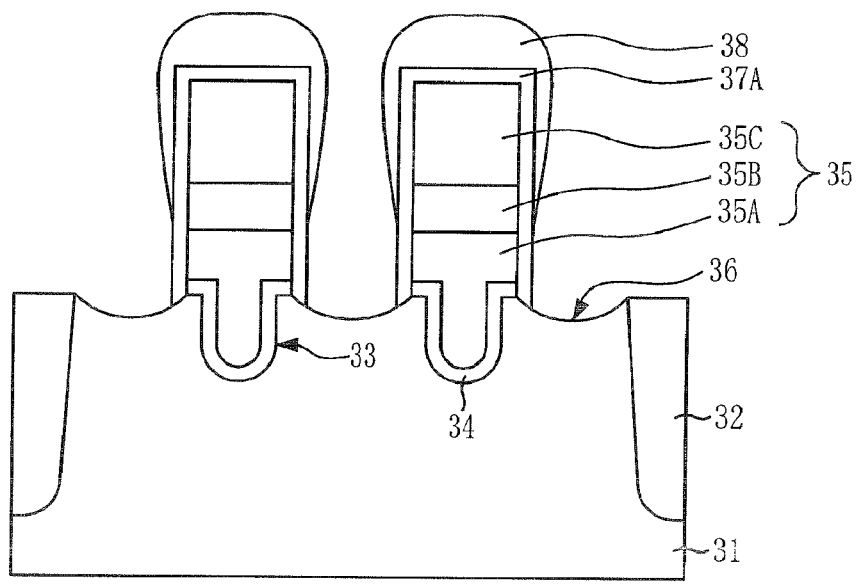

As shown in FIG. 3C, the gate spacer layer 37 is etched to expose the substrate 31 at the bottom of the plug region 36. Although a portion of the etching barrier layer 38 can be lost during the process of etching the gate spacer layer 37, a given thickness of the etching barrier layer 38 remains on the upper portion and the sidewalls of the gate pattern 35 so that the loss of the gate spacer layer 37 is prevented and only the substrate 31 at the bottom of the plug region 36 is selectively exposed. Also, in case that the gate spacer layer 37 is damaged so as to expose the gate hard mask 35C, the etching barrier layer 38 prevents the gate hard mask 35C from loss by an excessive etching.

Particularly, even in case that misalignment between the gate pattern 35 and the recess region 33 occurs, only the substrate 31 at the bottom of the plug region 36 is selectively exposed and a gate spacer 37A remains at sidewalls of the plug region 36. Thus, the electrical insulation between the recess region 33 and the SEG plug is secured.

Figure 3D:
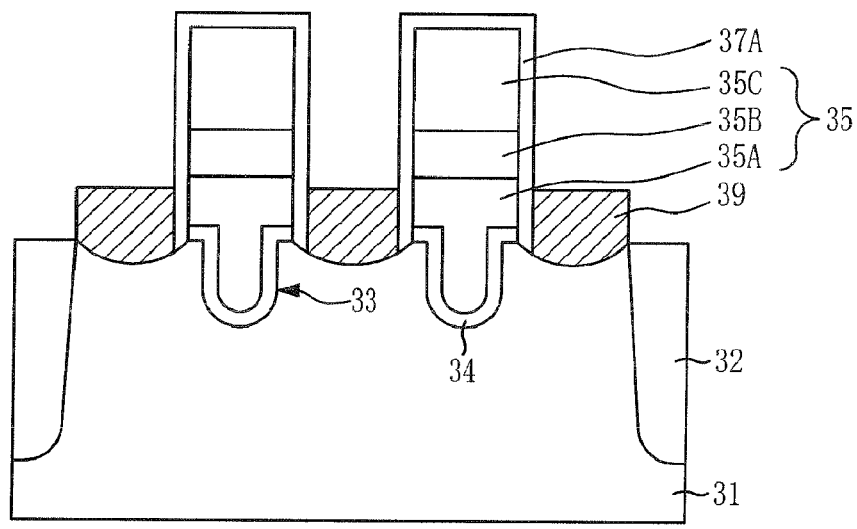

As shown in FIG. 3D, a first plug 39 is formed on the plug region 36. The first plug 39 can be an SEG plug formed through a selective epitaxial growth process, and it can be formed to have a thickness ranging from approximately 200 A to approximately 300 A. Also, a post-etch treatment (cleaning) can be performed before the first plug 39 is formed. Further, the etching barrier layer 38 can be either entirely removed by the post-etch treatment or left intact since it is an insulation layer and it does not affect the subsequent processes.

Since the first plug 39 is formed before formation of a subsequent cell spacer, a substrate contact area can be increased as much as the thickness of the cell spacer, thereby reducing cell contact resistance. Also, a gap-fill margin can be secured as much as a height of the first plug 39 when a subsequent insulation layer is formed.

Figure 3E:
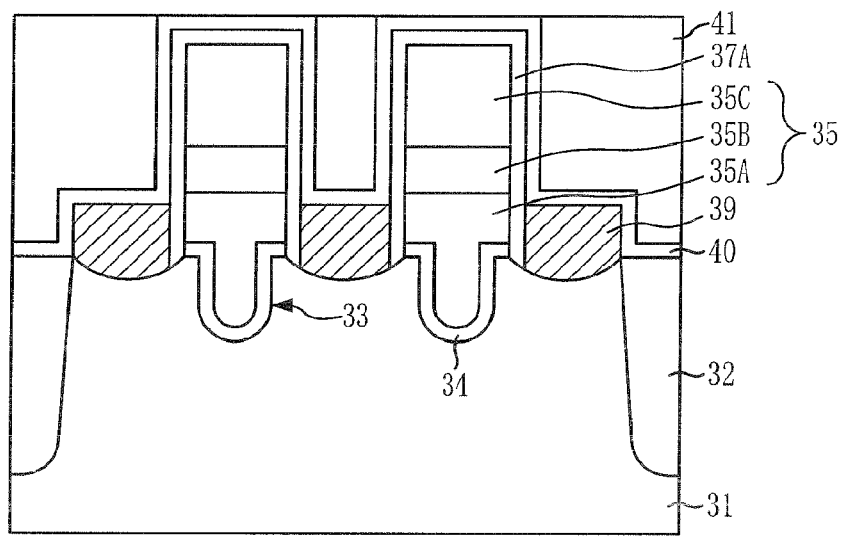

As shown in FIG. 3E, a cell spacer layer 40 is formed on the entire surface of the resulting structure including the first plug 39. Here, the cell spacer layer 40 is used to prevent the penetration of impurities into the substrate 31 and the first plug 39 from a subsequent insulation layer. The cell spacer layer 40 can be formed out of a nitride layer.

Then, the insulation layer 41 is formed to fill all spaces between the gate patterns 35 on the cell spacer layer 40. Here, the insulation layer 41 is used for the insulation between the gate patterns 35. The insulation layer 41 can be formed out of a boron phosphorus silicate glass (BPSG) having an excellent gap-fill margin. Subsequently, the insulation layer 41 is planarized until the cell spacer layer 40 is exposed.

Figure 3F:
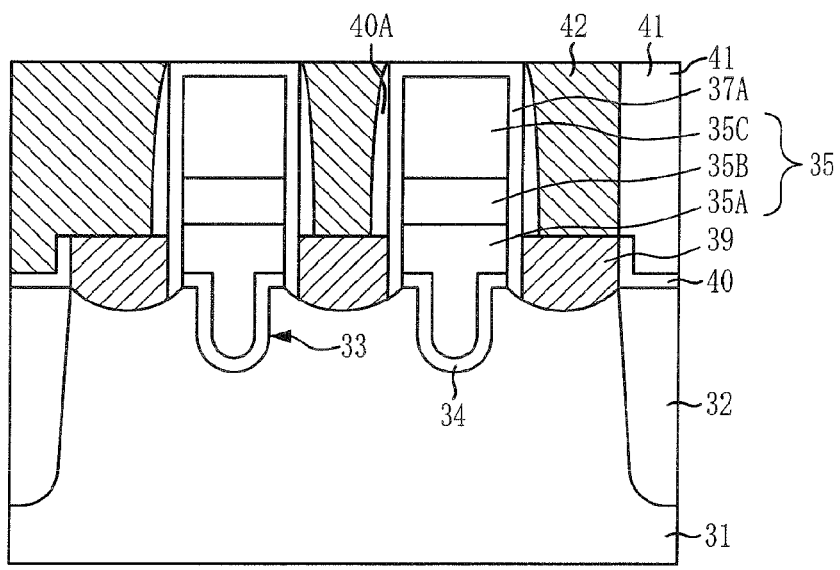

As shown in FIG. 3F, a contact hole is formed to expose the first plug 39 between the gate patterns 35 and then a conductive layer is formed and planarized to form a second plug 42.

In detail, a mask pattern is formed on the insulation layer 41 to define a region where a landing plug contact is to be formed between the gate patterns 35 and the contact hole is formed to expose the first plug 39 using a self-aligned contact etching process. Through the self-aligned contact etching process, the cell spacer layer 40 remains at sidewalls of the gate pattern 35. Hereinafter, the remained cell spacer layer 40 remaining at the sidewalls of the gate pattern 35 after the self-aligned contact etching process will be referred to as a cell spacer pattern 40A. Then, the conductive layer is formed on the first plug 39 to fill in the space between the gate patterns 35 and is planarized until the gate hard mask 35C is exposed so as to form the second plug 42. Here, the conductive layer can be a polysilicon and the planarization can be carried out by an etch-back process or a chemical-mechanical polishing (CMP). The first and second plugs 39 and 42 include a landing plug contact.

FIGS. 4A to 4F illustrate cross-sectional views of a method of fabricating a semiconductor device according to a third embodiment of the present invention.

Figure 4A:
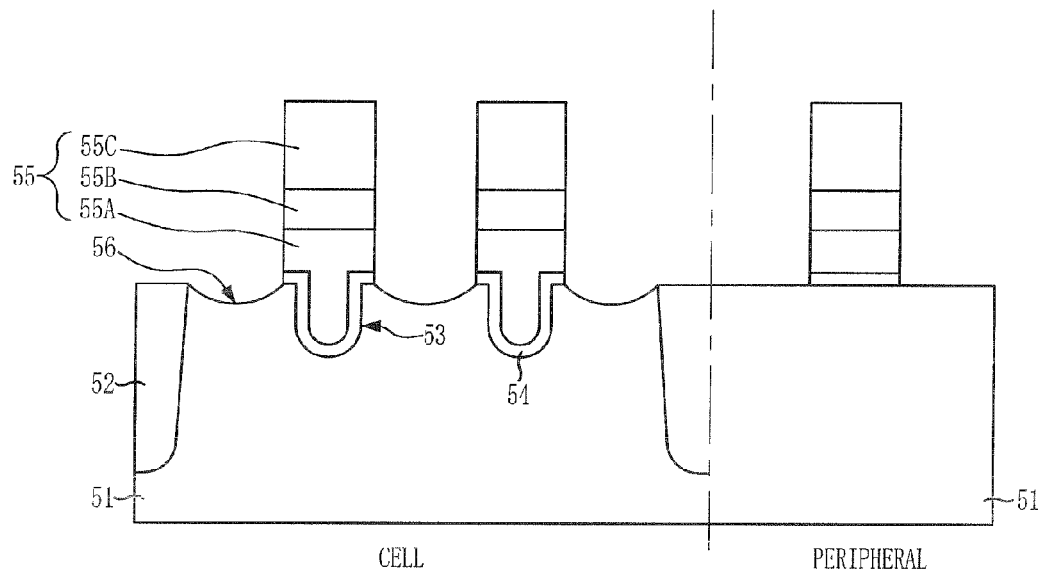
FIGS. 4A to 4F illustrate cross-sectional views of a method of fabricating a semiconductor device according to a third embodiment of the present invention.

As shown in FIG. 4A, an isolation layer 52 is formed on a cell area of a substrate 51 having the cell area and a peripheral area. Here, the substrate 51 can be a semiconductor substrate where a dynamic random access (DRAM) process is performed, and the isolation layer 52, which is used to define an active region, can be formed using a shallow trench isolation (STI) process.

The substrate 51 is selectively etched in a given depth to form a recess region 53. Here, the recess region 53 increases a channel length to improve refresh characteristics. Although the recess region 53 having a U-shape is illustrated in FIG. 4A, the recess region 53 can also have any one of a bulb shape, a pin shape or a saddle shape.

Then, a gate pattern 55, a portion of which is buried in the recess region 53 and the remaining portion of which protrudes from an upper portion of the substrate 51, is formed. A gate insulation layer 54 can be formed on the substrate 51 including the recess region 53 before the gate pattern 55 is formed. The gate pattern 55 can have a stacked structure including a first gate electrode 55A, a second gate electrode 55B and a gate hard mask 55C. The first gate electrode 55A can be a polysilicon, the second gate electrode 55B can be a metal or a metal silicide and the gate hard mask 55C can be a nitride layer.

Then, the substrate 51 between the gate patterns 55 in the cell area is etched in a given depth to be recessed. The recessed portion of the substrate 51 comprises a plug region 56 in which a landing plug contact is to be formed. The plug region 56 is formed to have a depth which does not affect a junction. The depth of the plug region 56 can be approximately 50 A to approximately 500 A. A mask pattern can be formed to cover the peripheral area to selectively recess the space between the gate patterns 55 only in the cell area. The mask pattern can be removed after the plug region 56 is formed in the cell area.

Figure 4B:
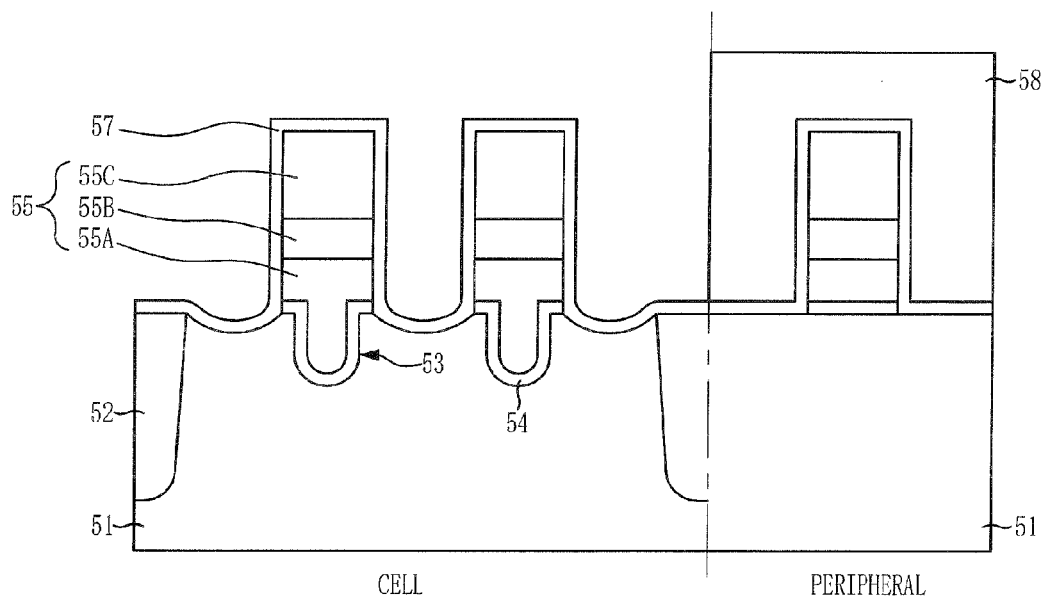

As shown in FIG. 4B, a gate spacer layer 57 is formed on the entire surface in the cell area including the plug region 56 and the peripheral area. Here, the gate spacer layer 57 can be formed to have a thickness ranging from approximately 80 A to approximately 150 A, considering thickness loss caused by a subsequent spacer etching process and post-etch treatment. In this case, the gate spacer layer 57 having a thickness ranging from approximately 30 A to approximately 50 A remains on sidewalls of the gate patterns 55 after the subsequent spacer etching process and post-etch treatment are performed. Thus, a sufficient electrical insulation between a subsequent selective epitaxial growth (SEG) plug and the recess region 53 is possible.

Then, a mask pattern 58 is formed on the gate spacer 57 in the peripheral area. Here, the mask pattern 58 is used to protect the peripheral area at the time of etching the gate spacer 57. The mask pattern 58 can be formed out of a photoresist layer.

Figure 4C:
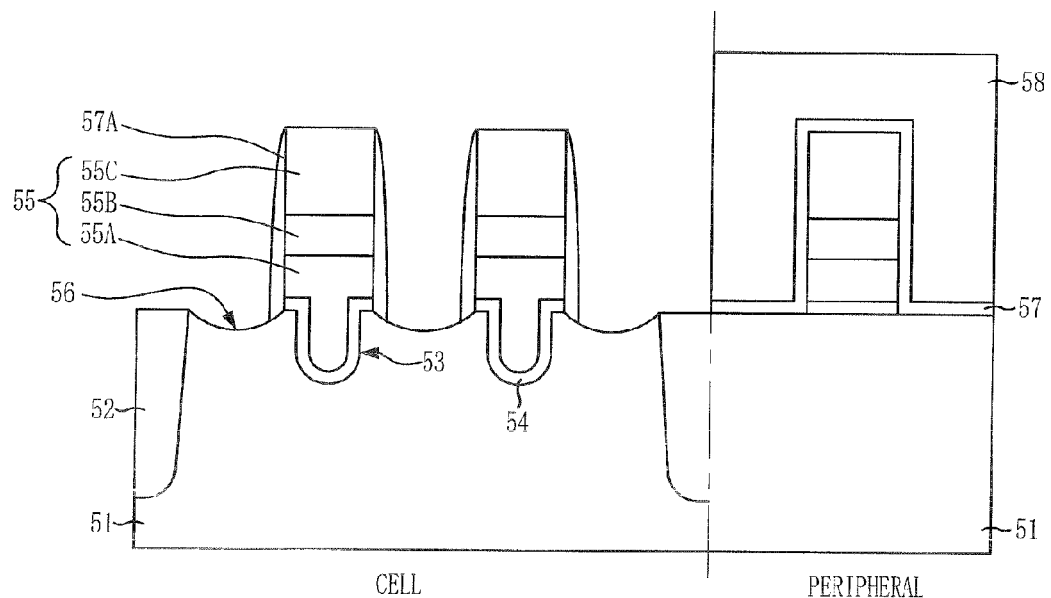

As shown in FIG. 4C, the gate spacer layer 57 in the cell area is etched to expose the substrate 51 at the bottom of the plug region 56. The gate spacer layer 57 is etched by an etch-back process, leaving the gate spacer layer 57 on the sidewalls of the gate pattern 55. Hereinafter, the gate spacer layer 57 remaining on the sidewalls of the gate pattern 55 will be referred to as the gate spacer 57A. Even in case that misalignment between the gate pattern 55 and the recess region 53 occurs, the electrical insulation between the recess region 53 and the SEG plug is secured because the gate spacer 57A remains at sidewalls of the plug region 56. Also, the peripheral area is protected by the mask pattern 58 at the time of etching the gate spacer 57.

Figure 4D:
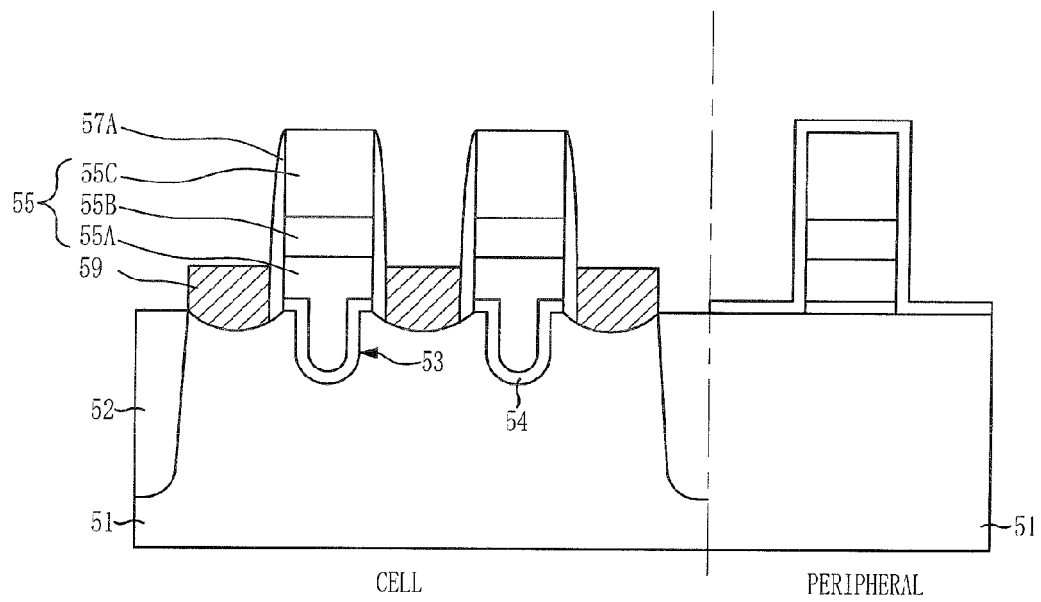

As shown in FIG. 4D, a first plug 59 is formed on the plug region 56. The first plug 59 can be an SEG plug formed through a selective epitaxial growth (SEG) process, and it can be formed to have a thickness ranging from approximately 200 A to approximately 300 A. Also, a post-etch treatment (cleaning) can be performed before the first plug 59 is formed.

Since the first plug 59 is formed before formation of a subsequent cell spacer, a substrate contact area can be increased as much as the thickness of the cell spacer, thereby reducing cell contact resistance. Also, a gap-fill margin can be secured as much as a height of the first plug 59 when a subsequent insulation layer is formed.

The mask pattern 58 is removed before or after the first plug 59 is formed. If the mask pattern 58 is formed out of a photoresist layer, it can be removed with an oxygen strip.

Figure 4E:
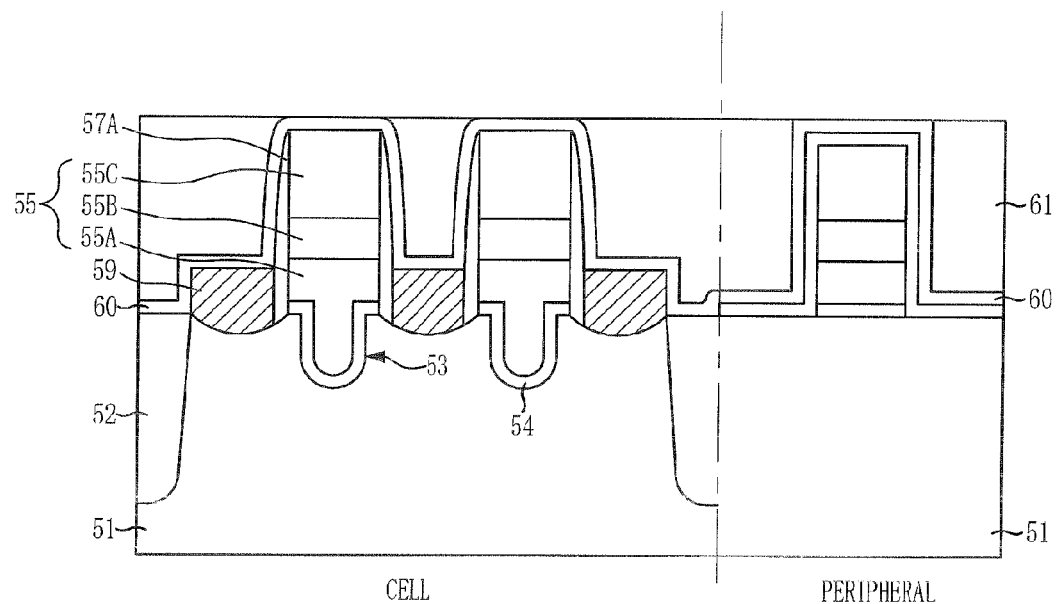

As shown in FIG. 4E, a cell spacer layer 60 is formed on the entire surface of the resulting structure including the first plug 59. Here, the cell spacer layer 60 is used to prevent the penetration of impurities into the substrate 51 and the first plug 59 from a subsequent insulation layer. The cell spacer layer 60 can be formed out of a nitride layer.

Then, an insulation layer 61 is formed to fill all spaces between the gate patterns 55 on the cell spacer layer 60. Here, the insulation layer 61 is used for the insulation between the gate patterns 55. The insulation layer 61 can be formed out of a boron phosphorus silicate glass (BPSG) having an excellent gap-fill margin. Subsequently, the insulation layer 61 can be planarized until the cell spacer layer 60 is exposed.

Figure 4F:
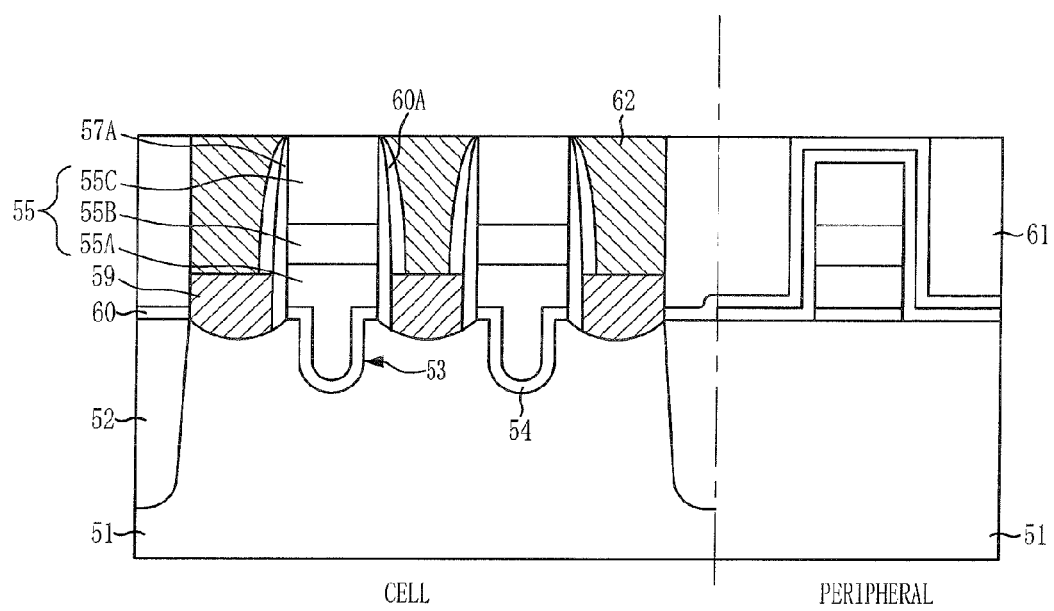

As shown in FIG. 4F, a contact hole is formed to expose the first plug 59 between the gate patterns 55 and then a conductive layer is formed and planarized to form a second plug 62.

In detail, a mask pattern is formed on the insulation layer 61 to define a region in which a landing plug contact is to be formed between the gate patterns 55 and the contact hole is formed to expose the first plug 59 using a self-aligned contact etching process. Through the self-aligned contact etching process, the cell spacer layer 60 in active region remains at sidewalls of the gate pattern 55. Hereinafter, the cell spacer layer 60 remaining at the sidewalls of the gate patterns 55 after the self-aligned contact etching process will be referred to as a cell spacer pattern 60A. Then, the conductive layer is formed on the first plug 59 to fill in a space between the gate patterns 55 and is planarized until the gate hard mask 55C is exposed so as to form the second plug 62. Here, the conductive layer can be a polysilicon and the planarization is carried out by an etch-back process or a chemical-mechanical polishing (CMP). The first and second plugs 59 and 62 comprise a landing plug contact.

FIGS. 5A to 5F illustrate cross-sectional views of a method of fabricating a semiconductor device according to a fourth embodiment of the present invention.

Figure 5A:
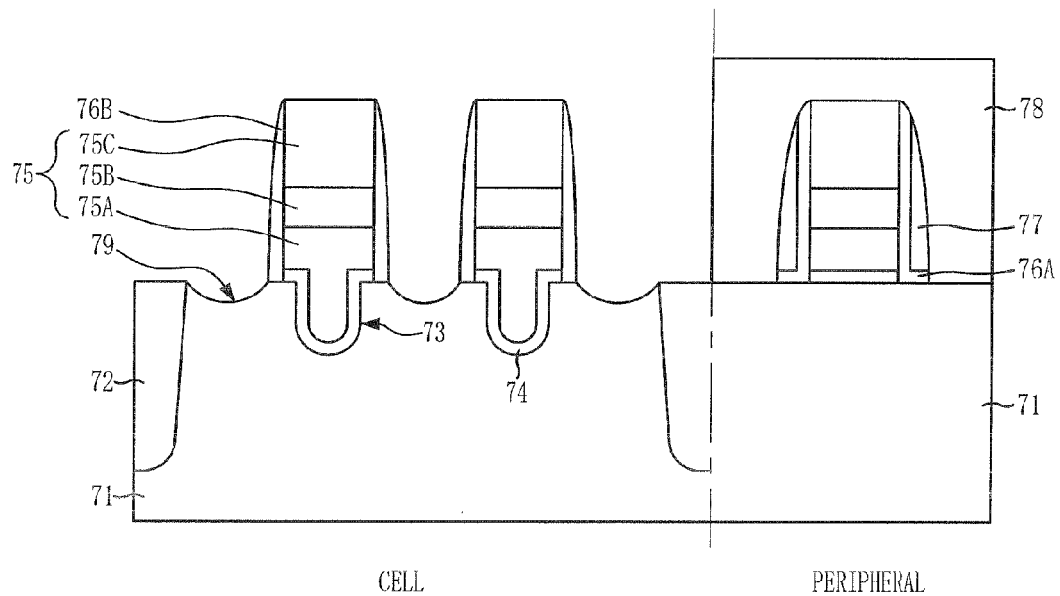
FIGS. 5A to 5E illustrate cross-sectional views of a method of fabricating a semiconductor device according to a fourth embodiment of the present invention.

As shown in FIG. 5A, an isolation layer 72 is formed on a cell area of a substrate 71 having the cell area and a peripheral area. Here, the substrate 71 can be a semiconductor substrate where a dynamic random access memory (DRAM) process is performed, and the isolation layer 72, which is used to define an active region, can be formed using a shallow trench isolation (STI) process.

The substrate 71 is selectively etched in a given depth to form a recess region 73. Here, the recess region 73 increases a channel length to improve refresh characteristics. Although the recess region 73 having a U-shape is illustrated in FIG. 5A, the recess region 73 can also have any one of a bulb shape, a pin shape or a saddle shape.

Then, a gate pattern 75, a portion of which is buried in the recess region 73 and the remaining portion of which protrudes from an upper portion of the substrate 71, is formed. A gate insulation layer 74 can be formed on the substrate 71 including the recess region 73 before the gate pattern 75 is formed. The gate pattern 75 can have a stacked structure including a first gate electrode 75A, a second gate electrode 75B and a gate hard mask 75C. The first gate electrode 75A can be a polysilicon, the second gate electrode 75B can be a metal or a metal silicide and the gate hard mask 75C can be a nitride layer.

A first gate spacer layer and an oxide layer for a spacer are formed on the entire surface of the resulting structure including the gate pattern 75. Then, the first gate spacer layer and the oxide layer for the spacer in the peripheral area are etched to form a sidewall protection layer at sidewalls of the gate pattern 75 in the peripheral area. The sidewall protection layer in the peripheral area may have a stacked structure including the first gate spacer 76A and the oxide layer 77. The first gate spacer 76A has a thickness ranging from approximately 10 A to approximately 60 A to endure a subsequent wet etching process to remove the oxide layer in the cell area. The first gate spacer 76A can be formed out of a nitride layer.

Then, a first mask pattern 78 is formed in the peripheral area. Here, the first mask pattern 78 is used to protect the peripheral area at the time of removing the oxide layer formed in the cell area and forming a plug region. The first mask pattern 78 can be formed out of a photoresist layer.

The oxide layer in the cell area is removed by a wet etching process. At this time, the first gate spacer layer of a nitride layer formed under the oxide layer prevents loss of the substrate 71 and the gate pattern 75 in the cell area by the wet etching process.

The first gate spacer layer between the gate patterns 75 is etched to expose the substrate 71. Thus, the first gate spacer only remains at the sidewalls of the gate pattern 75. Hereinafter, the first gate spacer layer which remains at the sidewalls of the gate pattern 75 in the cell area will be referred to as a first gate spacer pattern 76B.

Then, the substrate 71 exposed between the gate patterns 75 is recessed in a given depth. The recessed portion of the substrate 71 comprises the plug region 79 in which a landing plug contact is to be formed. The plug region 79 is formed to have a depth which does not affect a junction. The depth of the plug region 79 can be approximately 50 A to approximately 500 A.

Figure 5B:
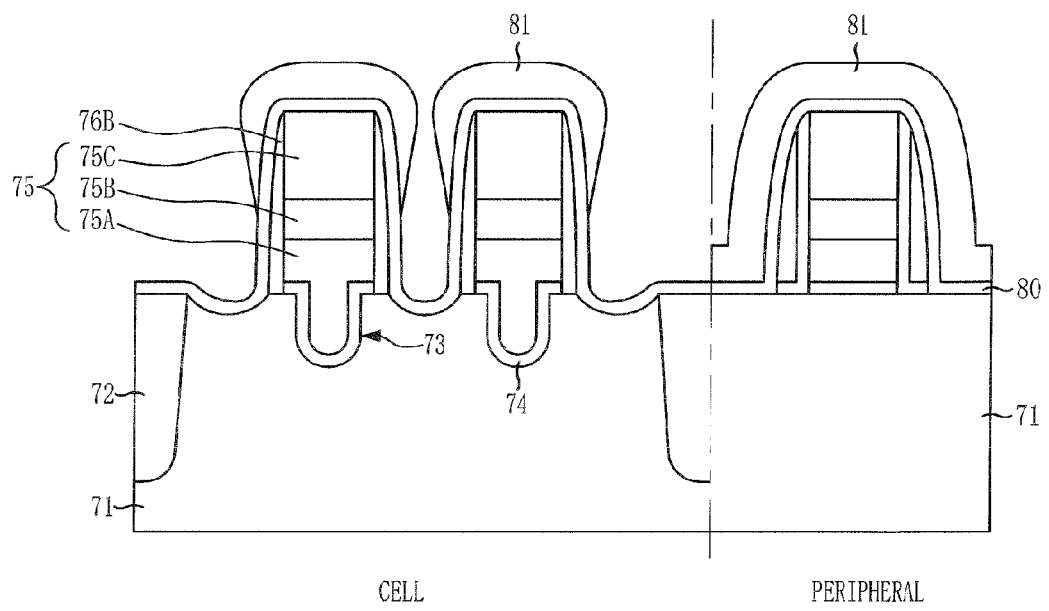

As shown in FIG. 5B, the first mask pattern 78 is removed. If the first mask pattern 78 is a photoresist layer, it can be removed with an oxygen strip.

Subsequently, a second gate spacer layer 80 is formed on the entire surface in the cell area including the plug region 79 and the peripheral area. Here, the second gate spacer layer 80 can be formed to have a thickness ranging from approximately 80 A to approximately 150 A, considering thickness loss caused by a subsequent spacer etching process and post-etch treatment. In this case, the second gate spacer layer 80 having a thickness ranging from approximately 30 A to approximately 50 A remains on sidewalls of the gate patterns 75 after the subsequent spacer etching process and post-etch treatment are performed. Thus, a sufficient electrical insulation between a selective epitaxial growth (SEG) plug and the recess region 73 is possible. Also, since the total thickness of the first and second gate spacers 76B and 80 is equal to the thickness of the conventional gate spacer, stacking the first and second gate spacers 76B and 80 does not affect or reduce a unit cell area.

Then, an etching barrier layer 81 is formed on the second gate spacer layer 80. Here, the etching barrier layer 81 formed on the upper portion of the gate pattern 75 is thicker than that formed at the sidewalls of the gate pattern 75 in the cell area. The thickness of the etching barrier layer 81 formed on the upper portion of the gate pattern 75 can range from approximately 300 A to approximately 800 A. The etching barrier layer 81 can be formed of a plasma enhanced undoped silicate glass (PE-USG). In the peripheral area, a pattern density is low so that the space between the gate patterns 75 is wide. Thus, the etching barrier layer 81 formed on the second gate spacer 80 in the peripheral area has a uniform thickness.

Figure 5C:
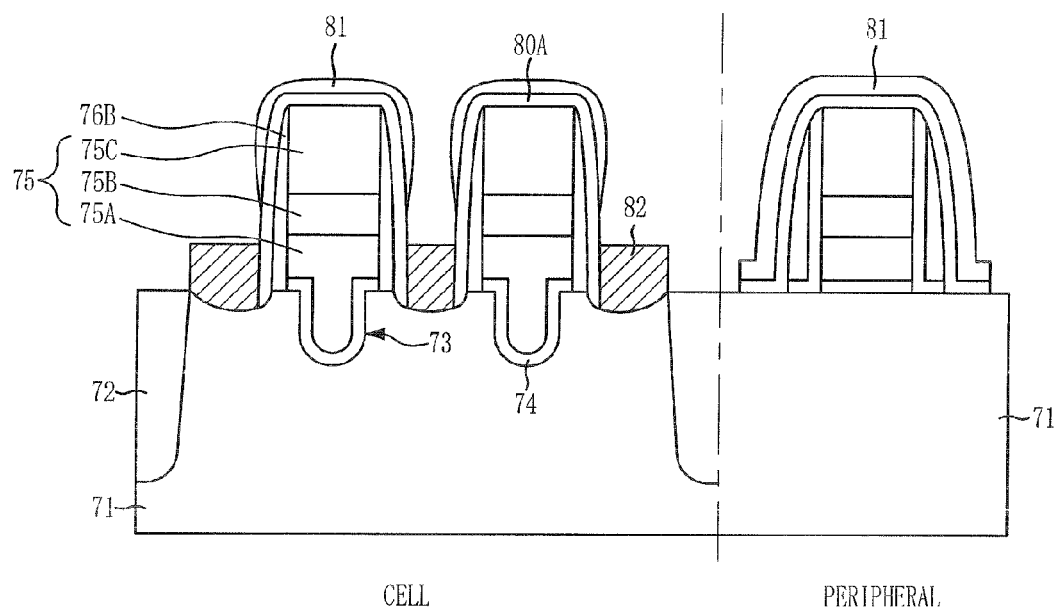

As shown in FIG. 5C, the second gate spacer layer 80 in the cell area is etched to expose the substrate 71 at the bottom of the plug region 79. Even in case that misalignment between the gate pattern 75 and the recess region 73 occurs, the electrical insulation between the recess region 73 and the SEG plug is secured because the second gate spacer layer 80 remains at sidewalls of the plug region 79. Although a portion of the etching barrier layer 81 can be lost during the process of etching the second gate spacer layer 80, a given thickness of the etching barrier layer 81 remains on the upper portion and at the sidewalls of the gate pattern 75 so that the loss of the second gate spacer layer 80 is prevented and only the substrate 71 at the bottom of the plug region 79 is selectively exposed. Also, in case that the second gate spacer layer 80 is damaged so that the gate hard mask 75C is exposed, the etching barrier layer 81 prevents the gate hard mask 75C from loss by an excessive etching. Hereinafter, the second gate spacer layer 80 remaining at the sidewalls of the gate patterns 75 after the second gate spacer etching will be referred to as a second gate spacer pattern 80A.

Then, a first plug 82 is formed on the plug region 79. The first plug 82 can be an SEG plug formed through the SEG process, and it can be formed to have a thickness ranging from approximately 200 A to approximately 300 A. Also, a post-etch treatment (cleaning) can be performed before the first plug 82 is formed. The etching barrier layer 81 can be either entirely removed by the post-etch treatment or left intact since it is an insulation layer and it does not affect subsequent processes.

Since the first plug 82 is formed before formation of a subsequent cell spacer, a substrate contact area can be increased as much as the thickness of the cell spacer, thereby reducing cell contact resistance. Also, a gap-fill margin can be secured as much as a height of the first plug 82 when a subsequent insulation layer is formed.

Figure 5D:
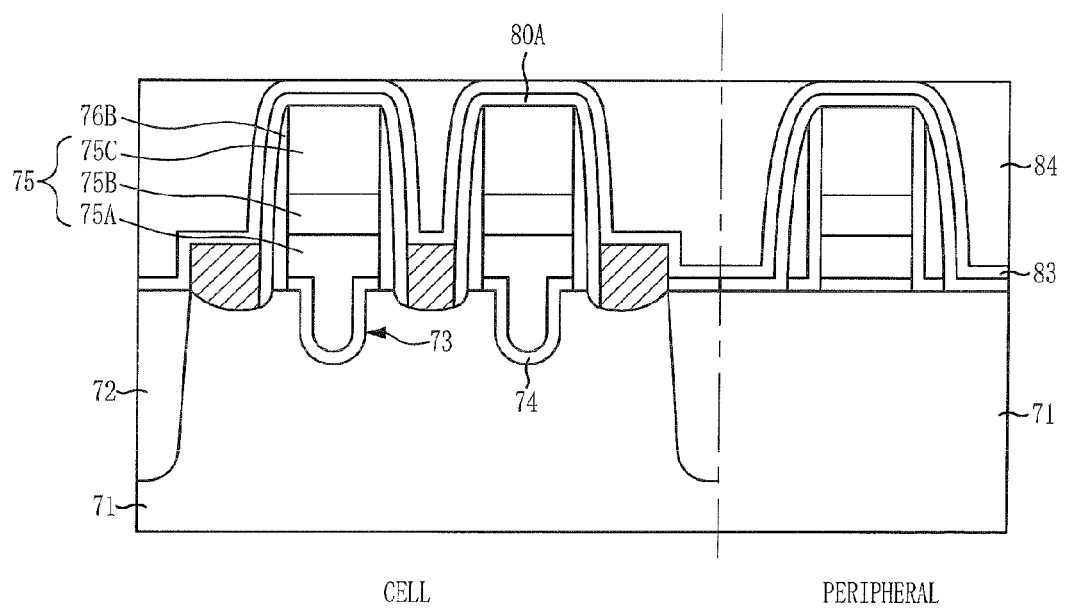

As shown in FIG. 5D, a cell spacer layer 83 is formed on the entire surface of a second resulting structure including the first plug 82. Here, the cell spacer layer 83 is used to prevent the penetration of impurities into the substrate 71 and the first plug 78 from a subsequent insulation layer. The cell spacer layer 83 can be formed out of a nitride layer.

Then, the insulation layer 84 is formed to fill all spaces between the gate patterns 75 on the cell spacer layer 83. Here, the insulation layer 84 is used for the insulation between the gate patterns 75. The insulation layer 84 can be formed out of a boron phosphorus silicate glass (BPSG) having an excellent gap-fill margin.

Subsequently, the insulation layer 84 can be planarized until the cell spacer layer 83 on the second gate spacer pattern 80A is exposed.

Figure 5E:
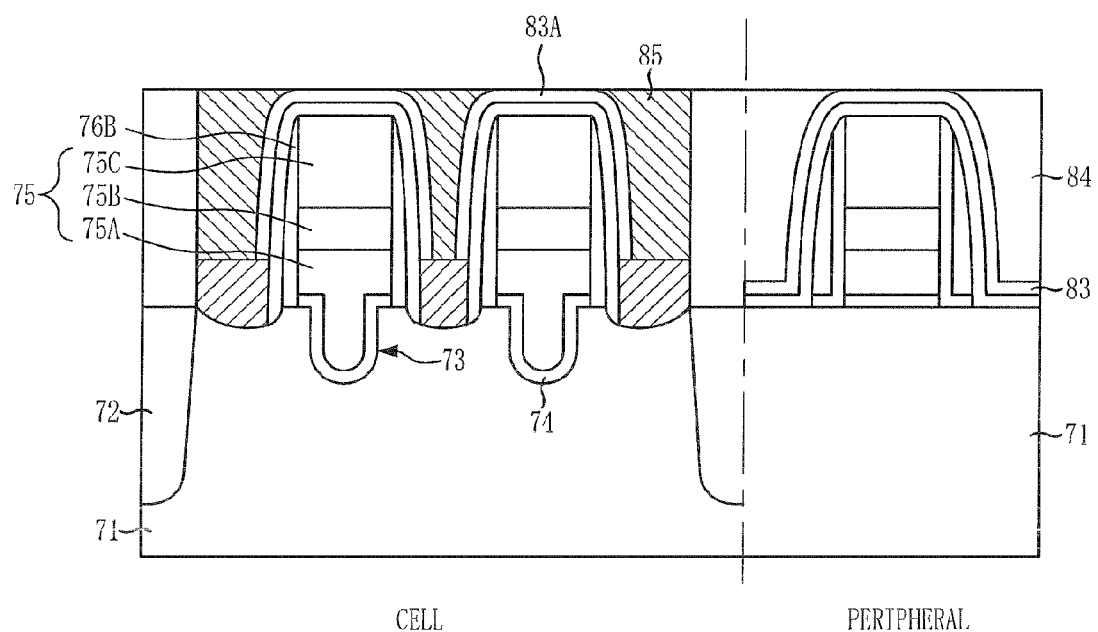

As shown in FIG. 5E, a contact hole is formed to expose the first plug 82 between the gate patterns 75 in the cell region, and then a conductive layer is formed and planarized to form a second plug 85.

In detail, a mask pattern is formed on the insulation layer 84 to define a region in which a landing plug contact is to be formed between the gate patterns 75 and the contact hole is formed to expose the first plug 82 using a self-aligned contact etching process. Through the self-aligned contact etching process, the cell spacer layer 83 remains at sidewalls of the gate pattern 75. Hereinafter, the cell spacer layer 83 remaining at the sidewalls of the gate patterns 75 after the self-aligned contact etching process will be referred to as a cell spacer pattern 83A. Then, the conductive layer is formed on the first plug 82 to fill in the space between the gate patterns 75 and is planarized until the gate hard mask 75C is exposed so as to form the second plug 85. Here, the conductive layer can be a polysilicon and the planarization is carried out by an etch-back process or a chemical-mechanical polishing. The first and second plugs 82 and 85 comprise a landing plug contact.

Figure 6:
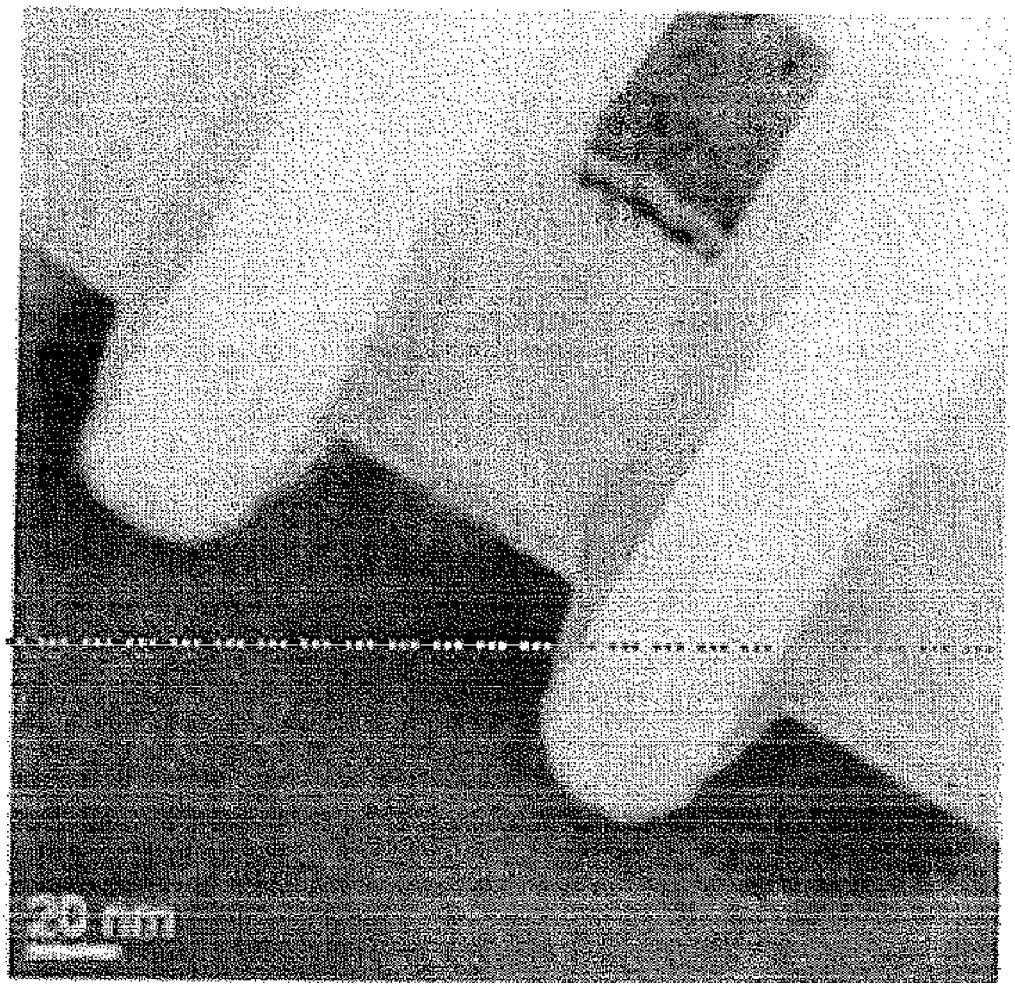
FIG. 6 illustrates a micrographic view of a semiconductor device according to the present invention.

FIG. 6 illustrates a micrographic view of a semiconductor device according to the present invention.

Referring to FIG. 6, a gate spacer is formed at sidewalls of a recessed plug region between gate patterns. Even in a case that misalignment between the gate pattern and a recess region occurs, the electrical insulation between the recess region and the SEG plug is secured because the gate spacer is formed at the sidewalls of the plug region.

The present invention forms a first plug before formation of a cell spacer to increase a contact area between a substrate and the plug, thereby reducing cell contact resistance. Also, the present invention secures a gap-fill margin as much as a height of the first plug at the time of forming an insulation layer which fills in the space between gate patterns.

Further, the present invention forms a gate spacer after forming recessed plug regions between the gate patterns so that the gate spacer remains at sidewalls of the plug regions and thereby securing the electrical insulation between the recess region of the gate pattern and the plug is secured even in case that misalignment between the gate pattern and the recess region occurs.

While the present invention has been described with respect to the specific embodiments, the above embodiment of the present invention is illustrative and not limitative. It will be apparent to those skilled in the art that various changes and modifications may be made without departing from the spirit and scope of the invention as defined in the following claims.

What is claimed is:

1. A method of fabricating a semiconductor device, the method comprising:
    forming gate patterns over a substrate;
    forming a recess in the substrate between the gate patterns, thereby forming a first resultant structure including the recess;
    forming a gate spacer layer on an entire surface of the first resultant structure including the gate patterns;
    etching the gate spacer layer at a bottom of the recess;
    forming a plug on the recess through an epitaxial growth process, thereby forming a second resultant structure including the plug;
    forming a cell spacer layer on an entire surface of the second resultant structure;

forming an insulation layer on the cell spacer layer to fill in spaces between the gate patterns;

etching the insulation layer until the cell spacer layer on the gate patterns is exposed;

exposing the plug by etching the insulation layer and the cell spacer layer between the gate patterns;

forming a conductive layer over the plug; and planarizing the conductive layer to form a landing plug contact.

2. The method of claim 1, wherein the gate patterns have a recessed gate structure.

3. The method of claim 1, wherein the gate spacer layer includes a nitride layer.

4. The method of claim 3, wherein the gate spacer layer is formed to have a thickness ranging from approximately 80 Å to approximately 150 Å.

5. The method of claim 1, wherein etching the gate spacer layer is performed by an etch-back process.

6. The method of claim 1, wherein the gate spacer layer remains on the sidewalls of both the gate patterns and the recess after etching the gate spacer layer.

7. The method of claim 1, further comprising
forming an etching barrier layer on an upper portion and sidewalls of the gate patterns before the gate spacer layer is etched.

8. The method of claim 7, wherein the etching barrier layer formed on the upper portion of the gate patterns is thicker than that formed at the sidewalls of the gate patterns.

9. The method of claim 8, wherein the etching barrier layer is formed to have a thickness ranging from approximately 300 Å to approximately 800 Å on the upper portion of the gate patterns.

10. The method of claim 9, wherein the etching barrier layer is plasma enhanced undoped silicate glass (PE-USG).

11. The method of claim 1, wherein the recess in the substrate is formed to have a depth of approximately 50 Å to approximately 500 Å.

12. The method of claim 1, wherein the epitaxial growth process with which the plug is formed is a selective epitaxial growth process (SEG).

13. The method of claim 12, wherein the plug is formed to have a thickness ranging from approximately 200 Å to approximately 300 Å.

14. The method of claim 1, wherein the cell spacer layer includes a nitride layer.

15. The method of claim 1, wherein the insulation layer is boron phosphorus silicate glass (BPSG).

16. The method of claim 1, wherein the conductive layer includes polysilicon.

17. The method of claim 1, wherein etching the insulation layer and planarizing the conductive layer are carried out by an etch-back process or a chemical-mechanical polishing (CMP).

18. A method of fabricating a semiconductor device, the method comprising:
forming gate patterns over a substrate having a cell area and a peripheral area;
forming a recess in the substrate between the gate patterns in the cell area, thereby forming a first resultant structure;
forming a gate spacer layer on an entire surface of the first resultant structure including the recess;
forming a mask pattern on the gate spacer layer in the peripheral area;
etching the gate spacer layer at a bottom of the recess in the cell area;

forming a plug on the recess through an epitaxial growth process;

removing the mask pattern, thereby forming a second resultant structure including the plug;

forming a cell spacer layer on the second resultant structure;

forming an insulation layer on the cell spacer layer to fill in spaces between the gate patterns;

etching the insulation layer until the cell spacer layer on the gate pattern is exposed; and exposing the plug by etching the insulation layer and the cell spacer layer between the gate patterns.

19. The method of claim 18, wherein the gate patterns have a recessed gate structure.

20. The method of claim 18, wherein the gate spacer layer includes a nitride layer.

21. The method of claim 20, wherein the gate spacer layer is formed to have a thickness ranging from approximately 80 Å to approximately 150 Å.

22. The method of claim 18, wherein the gate spacer layer remains on the sidewalls of both the gate patterns and the recess after etching the gate spacer layer.

23. The method of claim 18, wherein the recess in the substrate is formed to have a depth of approximately 50 Å to approximately 500 Å.

24. The method of claim 18, wherein the epitaxial growth process with which the plug is formed is a selective epitaxial growth process (SEG).

25. The method of claim 24, wherein the plug is formed to have a thickness ranging from approximately 200 Å to approximately 300 Å.

26. The method of claim 18, wherein forming the mask pattern includes:
forming a photoresist layer on the gate spacer layer; and
leaving the photoresist layer in the peripheral area through exposure and development processes.

27. The method of claim 18, further comprising
removing the mask pattern before the plug is formed.

28. The method of claim 18, wherein the cell spacer layer includes a nitride layer.

29. The method of claim 18, wherein the insulation layer includes boron phosphorus silicate glass (BPSG).

30. The method of claim 18, further comprising:
forming a conductive layer over the plug; and
planarizing the conductive layer to form a landing plug contact;
wherein the conductive layer includes polysilicon.

31. The method of claim 30, wherein etching of the insulation layer and planarizing the conductive layer are carried out by an etch-back process or a chemical-mechanical polishing (CMP).

32. A method of fabricating a semiconductor device, the method comprising:
forming gate patterns over a substrate having a cell area and a peripheral area, thereby forming a first resultant structure;
forming a first gate spacer layer on an entire surface of the first resultant structure including the gate patterns;
forming a mask pattern on the first gate spacer layer in the peripheral area;
etching the first gate spacer layer to expose the substrate between the gate patterns in the cell area;
forming a recess in the exposed substrate;
removing the mask pattern, thereby forming a second resultant structure;
forming a second gate spacer layer on an entire surface of the second resultant structure including the recess;

etching the second gate spacer layer at a bottom of the recess in the cell area;

forming a plug on the recess in the cell area through an epitaxial growth process, thereby forming a third resultant structure including the plug;

forming a cell spacer layer on the third resultant structure;

forming an insulation layer on the cell spacer layer to fill in spaces between the gate patterns;

etching the insulation layer until the cell spacer layer on the gate patterns is exposed; and exposing the plug by etching the insulation layer and the cell spacer layer between the gate patterns.

33. The method of claim 32, wherein the gate patterns have a recessed gate structure.

34. The method of claim 32, wherein the first and second gate spacer layers include nitride layers.

35. The method of claim 34, wherein the first gate spacer layer is formed to have a thickness ranging from approximately 10 Å to approximately 60 Å and the second gate spacer layer is formed to have a thickness ranging from approximately 80 Å to approximately 150 Å.

36. The method of claim 34, wherein the second gate spacer layer remains both on the sidewalls of the recess and on the first gate spacer layer at the sidewalls of the gate patterns after etching the second gate spacer layer.

37. The method of claim 32, further comprising
forming an etching barrier layer on the second gate spacer layer in the cell area and in the peripheral area.

38. The method of claim 37, wherein the etching barrier layer formed on the upper portion of the gate patterns is thicker than that formed at the sidewalls of the gate patterns in the cell area.

39. The method of claim 38, wherein the etching barrier layer is formed to have a thickness ranging from approximately 300 Å to approximately 800 Å on the upper portion of the gate patterns.

40. The method of claim 37, wherein the etching barrier layer includes plasma enhanced undoped silicate glass (PE-USG).

41. The method of claim 32, wherein the recess has a depth of approximately 50 Å to approximately 500 Å.

42. The method of claim 32, wherein the epitaxial growth process with which the plug is formed is a selective epitaxial growth process (SEG).

43. The method of claim 42, wherein the plug is formed to have a thickness ranging from approximately 200 Å to approximately 300 Å.

44. The method of claim 32, wherein the cell spacer layer includes a nitride layer.

45. The method of claim 32, wherein the insulation layer includes boron phosphorus silicate glass (BPSG).

46. The method of claim 32, further comprising:
forming a conductive layer over the plug; and
planarizing the conductive layer to form a landing plug contact;
wherein the conductive layer includes polysilicon.

47. The method of claim 46, wherein etching of the insulation layer and planarizing the conductive layer are carried out by an etch-back process or a chemical-mechanical polishing (CMP).

48. The method of claim 1, wherein
each of the gate patterns comprises at least one gate electrode; and
the gate spacer layer is formed on the entire surface of the first resultant structure to be in direct contact with the at least one gate electrode of each of the gate patterns.

49. The method of claim 2, wherein
the gate patterns having the recessed gate structure are formed to be partially buried in the substrate and to partially project outside the substrate.

50. The method of claim 1, wherein
the planarizing the conductive layer includes etching the conductive layer and the cell spacer layer formed above an upper surface of the gate patterns to planarize the conductive layer to be aligned with the upper surface of the gate patterns, thereby forming the landing plug contact, and
the cell spacer is formed between the landing plug and the gate spacer layer.

51. The method of claim 18, further comprising, after the exposing the plug by etching the insulation layer and the cell spacer layer between the gate patterns:
forming a conductive layer over the plug; and
etching the conductive layer and the cell spacer layer formed above an upper surface of the gate patterns to planarize the conductive layer to be aligned with the upper surface of the gate patterns, thereby forming a landing plug contact,
wherein the cell spacer is formed between the landing plug and the gate spacer layer.

52. The method of claim 32, further comprising after the exposing the plug by etching the insulation layer and the cell spacer layer between the gate patterns:
forming a conductive layer over the plug; and
etching the conductive layer and the cell spacer layer formed above an upper surface of the gate patterns to planarize the conductive layer to be aligned with the upper surface of the gate patterns, thereby forming a landing plug contact,
wherein the cell spacer is formed between the landing plug and the gate spacer layer.

* * * * *